(12) United States Patent
Park et al.

(10) Patent No.: US 8,194,425 B2
(45) Date of Patent: Jun. 5, 2012

(54) FREQUENCY MODULATION DEVICE AND SWITCHING MODE POWER SUPPLY USING THE SAME

(75) Inventors: Young-Bae Park, Anyang (KR); Gwan-Bon Koo, Bucheon (KR)

(73) Assignee: Fairchild Korea Semiconductor, Ltd., Bucheon (KR)

( * ) Notice: Subject to any disclaimer, the term of this patent is extended or adjusted under 35 U.S.C. 154(b) by 868 days.

(21) Appl. No.: 12/220,768

(22) Filed: Jul. 25, 2008

(65) Prior Publication Data
US 2009/0028235 A1  Jan. 29, 2009

(30) Foreign Application Priority Data
Jul. 26, 2007 (KR) .................. 10-2007-0075119

(51) Int. Cl.
*H02M 3/335* (2006.01)
(52) U.S. Cl. ............. 363/21.18; 323/288; 331/179; 363/21.12; 363/41
(58) Field of Classification Search .......... 323/282, 323/288; 331/106, 177 V, 179; 363/21.04, 363/21.1, 21.11, 21.12, 21.13, 21.15, 21.18, 363/39, 41
See application file for complete search history.

(56) References Cited

U.S. PATENT DOCUMENTS

| | | | |
|---|---|---|---|
| 6,107,851 A | 8/2000 | Balakirshnan | |
| 6,229,366 B1 | 5/2001 | Balakirshnan | |
| 6,249,876 B1 | 6/2001 | Balakrishnan | |
| 6,326,859 B1 * | 12/2001 | Goldman et al. | 331/143 |
| 6,597,159 B2 | 7/2003 | Yang | |
| 6,661,679 B1 * | 12/2003 | Yang et al. | 363/41 |
| 7,026,851 B2 | 4/2006 | Yang et al. | |
| 7,504,810 B1 * | 3/2009 | Tagare | 323/282 |
| 7,701,305 B2 * | 4/2010 | Lin et al. | 331/143 |
| 2002/0044463 A1 * | 4/2002 | Bontempo et al. | 363/21.07 |
| 2006/0049887 A1 * | 3/2006 | Munker et al. | 331/179 |
| 2006/0198167 A1 * | 9/2006 | Nakamura | 363/16 |
| 2010/0165675 A1 * | 7/2010 | Ye et al. | 363/39 |

* cited by examiner

*Primary Examiner* — Adolf Berhane
*Assistant Examiner* — Fred E Finch, III
(74) *Attorney, Agent, or Firm* — Sidley Austin LLP (57) ABSTRACT

The present invention relates to a frequency modulation device and a switching mode power supply using the frequency modulation device. To prevent electro-magnetic interference (EMI), it is required to slightly vary a switching operation frequency in an SMPS operation. In some embodiments, at least one first signal having a predetermined cycle is generated, a second signal corresponding to a level of a first signal is generated at a turn-off time of a switch, a first reference voltage having at least two different levels is generated according to the second signal, and an oscillator signal for increasing along a first slope during a first period and decreasing along a second slope during a second period between the first reference voltage and a second reference voltage having a level that is different from the first reference voltage is generated.

26 Claims, 7 Drawing Sheets

FREQUENCY MODULATION DEVICE AND SWITCHING MODE POWER SUPPLY USING THE SAME

CROSS-REFERENCE TO RELATED APPLICATION

This application claims priority to and the benefit of Korean Patent Application No. 10-2007-0075119 filed in the Korean Intellectual Property Office on Jul. 26, 2007, the entire contents of which are incorporated herein by reference.

BACKGROUND

1. Field of the Invention

The present invention relates to a frequency modulation device for irregularly modulating an operational frequency and a switching mode power supply (SMPS) using the frequency modulation device.

2. Description of the Related Art

A switching mode power supply (SMPS) is a device that rectifies an input AC voltage to an input DC voltage (DC-Link voltage) and that converts the input DC voltage to an output DC voltage having a different level. The output DC voltage can be higher or lower than the input DC voltage. The SMPS is generally used for electronic devices such as a battery charger of a mobile phone or an adapter of a laptop computer.

In some SMPS switching noise is generated when a switching operation is performed. The switching noise can cause electro-magnetic interference (EMI) between electronic devices which receive power through the SMPS. The switching noise is generated by harmonics of a switching operation frequency of a switch of the SMPS. The EMI can cause problems by disturbing an operation of peripheral electronic devices. Accordingly, sometime additional devices such as a filter are provided to the SMPS to prevent the EMI. However, this increases the production cost.

The above information disclosed in this Background section is only for enhancement of understanding of the background of the invention and therefore it may contain information that does not form the prior art that is already known in this country to a person of ordinary skill in the art.

SUMMARY

Briefly and generally, embodiments of a frequency modulation device prevent an electro-magnetic interference (EMI) generated by a switching mode power supply (SMPS) using the frequency modulation device.

In an embodiment, a frequency modulation device includes a counter, a latch unit, a reference signal generator, and a pulse width modulation (PWM) oscillator. The counter uses a first clock signal having a predetermined cycle and generates at least one first signal having a cycle of an integer times the cycle of the first clock signal. The latch unit detects the first signal at a predetermined point of time and generates a second signal corresponding to a level of the first signal. The reference signal generator generates a first reference signal having at least two different levels according to the second signal. The PWM oscillator generates an oscillator signal that increases in a first slope and decreases in a second slope between the first reference signal and a second reference signal having a level that is different from that of the first reference signal. The PWM oscillator includes a capacitor, a first comparator for comparing the first reference signal and the oscillator signal, a second comparator for comparing the second reference signal and the oscillator signal, a source-current source for charging the capacitor, a sync-current source for discharging the capacitor, a first switch coupled between the capacitor and the source-current source, a second switch coupled between the capacitor and the sync-current source, and an SR flipflop for controlling an on/off operation of the first and second switches according to output signals of the first and second comparators. The oscillator signal has a voltage that is the same as that charged in the capacitor, the second switch is turned off when the first switch is turned on, and the second switch is turned on when the first switch is turned off. In this case, the first slope is determined according to capacitance of the capacitor and the source-current source, and the second slope is determined according to the capacitance of the capacitor and the sync-current source. A set terminal of the SR flipflop is coupled to an output terminal of the first comparator, a reset terminal of the SR flipflop is coupled to an output terminal of the second comparator, the first reference signal is higher than the second reference signal, the first switch is turned off when the oscillator signal is higher than the first reference signal, and the second switch is turned off when the oscillator signal is reduced to the second reference signal. The oscillator signal and the first reference signal are respectively input to an inverted terminal and a non-inverted terminal of the first comparator, the second reference signal and the oscillator signal are respectively input to an inverted terminal and a non-inverted terminal of the second comparator, the first and second switches are respectively driven in response to an output signal of an inverted output terminal of the SR flipflop and an output signal of an output terminal of the SR flipflop and are turned on in response to a signal of a high level, and the SR flipflop outputs the signal of the high level to the output terminal and a signal of a low level to the inverted output terminal when the set terminal of the SR flipflop receives the signal of the low level and the reset terminal of the SR flipflop receives the signal of the high level, and outputs the signal of the low level to the output terminal and the signal of the high level to the inverted output terminal when the set terminal receives the signal of the high level and the reset terminal receives the signal of the low level. A reset terminal of the SR flipflop is coupled to an output terminal of the first comparator, a set terminal of the SR flipflop is coupled to an output terminal of the second comparator, the second reference signal is higher than the first reference signal, the first switch is turned off when the oscillator signal is higher than the second reference signal, and the second switch is turned off when the oscillator signal is reduced to the first reference signal. The counter includes a first toggle flipflop for generating the first signal by using the first clock signal, a signal of a first level is input to a first input terminal of the first toggle flipflop, the first clock signal is input to a second input terminal of the first toggle flipflop, the counter is synchronized with a first point of time of the first clock signal to generate the first signal in response to the signal of the first level, the latch unit includes a first D flipflop including a first input terminal receiving the first signal and a second input terminal externally receiving a control signal, the predetermined point of time is a point of time where a level of the control signal is varied from a first level to a second level, the reference signal generator includes at least three resistors coupled in series, a first switch is coupled in parallel to one of three resistors, and the first switch is turned on/off according to the second signal. In this case, the counter further includes a second toggle flipflop including a first input terminal receiving the signal of the first level and a second input terminal receiving the first signal and is synchronized with a second point of time of the first signal to generate a third signal in response to the signal of the first level, the latch unit further includes a second D flipflop including a first input terminal receiving the third signal and a second input signal receiving the control signal, the second D flipflop detects the third signal at the predetermined point of time to generate a fourth signal corresponding to a level of the third signal, the reference signal generator further includes a second resistor coupled in series to the at least three resistors and further includes a second switching element coupled in parallel to the second resistor, and the second switching element is turned on/off according to the fourth signal. The first point of time is rising edge timing of the first clock signal, a second point of time is rising edge timing of the first signal, the first toggle flipflop inverts a current output state of the first signal in response to the signal of the first level at the first point of time, and the second toggle flipflop inverts a current output state of the third signal in response to the signal of the first level at the second point of time.

In another embodiment, a switching mode power supply (SMPS) includes a transformer and a main switch coupled to a primary coil of the transformer, and supplies power to a secondary coil of the transformer according to a switching operation of the main switch. The SMPS includes a frequency modulation device and a switch controller. The frequency modulation device generates an oscillator signal having a first cycle. The switch controller generates a gate control signal for controlling the main switch by using a pulse width modulation (PWM) clock signal having a second cycle corresponding to the first cycle, a feedback signal corresponding to a voltage of the secondary coil of the transformer, and a detection signal corresponding to a current flowing through the main switch. The frequency modulation device generates at least one first signal having a predetermined cycle, generates a second signal corresponding to a level of the first signal at a turn-off time of the main switch, generates a first reference signal having at least two different levels according to the second signal, and generates an oscillator signal that increases along a first slope during a first period and decreases along a second slope during a second period between the first reference signal and a second reference signal having a level that is different from that of the first reference signal, and the first cycle is a sum of the first and second periods. The frequency modulation device includes a counter, a latch unit, a reference signal generator, and a PWM oscillator. The counter uses a first clock signal having a predetermined cycle to generate at least one first signal having a cycle of an integer times the cycle of the first clock signal. The latch unit detects a level of the gate control signal, detects the turn-off time, detects the first signal at the turn-off time, and generates the second signal corresponding to the level of the first signal. The reference signal generator generates the first reference signal having at least two different levels according to the second signal. The PWM oscillator generates the oscillator signal. In this case, the PWM oscillator includes a capacitor, a first comparator, a second comparator, a source-current source, a sync-current source, a first switch, a second switch, and an SR flipflop. The first comparator compares the first reference signal and the oscillator signal. The second comparator compares the second reference signal and the oscillator signal. The source-current source charges the capacitor. The sync-current source discharges the capacitor. The first switch is coupled between the capacitor and the source-current source. The second switch is coupled between the capacitor and the sync-current source. The SR flipflop controls an on/off operation of the first and second switches according to output signals of the first and second comparators. The oscillator signal has a voltage that is the same as that charged in the capacitor, the second switch is turned of when the first switch is turned on, and the second switch is turned on when the first switch is turned off. In this case, the first slope is determined according to capacitance of the capacitor and the source-current source, and the second slope is determined according to the capacitance of the capacitor and the sync-current source. A set terminal of the SR flipflop is coupled to an output terminal of the first comparator, a reset terminal of the SR flipflop is coupled to an output terminal of the second comparator, the first reference signal is higher than the second reference signal, the first switch is turned off when the oscillator signal is higher than the first reference signal, and the second switch is turned off when the oscillator signal is reduced to the second reference signal. The oscillator signal and the first reference signal are respectively input to an inverted terminal and a non-inverted terminal of the first comparator, the second reference signal and the oscillator signal are respectively input to an inverted terminal and a non-inverted terminal of the second comparator, the first and second switches are respectively driven in response to an output signal of an inverted output terminal of the SR flipflop and an output signal of an output terminal of the SR flipflop and are turned on in response to a signal of a high level, and the SR flipflop outputs the signal of the high level to the output terminal and a signal of a low level to the inverted output terminal when the set terminal of the SR flipflop receives the signal of the low level and the reset terminal of the SR flipflop receives the signal of the high level, and outputs the signal of the low level to the output terminal and the signal of the high level to the inverted output terminal when the set terminal receives the signal of the high level and the reset terminal receives the signal of the low level. The counter includes a first toggle flipflop for generating the first signal by using the first clock signal, a signal of a first level is input to a first input terminal of the first toggle flipflop, the first clock signal is input to a second input terminal of the first toggle flipflop, the counter is synchronized with a first point of time of the first clock signal to generate the first signal in response to the signal of the first level, the latch unit includes a first D flipflop including a first input terminal receiving the first signal and a second input terminal externally receiving a control signal, the predetermined point of time is a point of time where a level of the control signal is varied from a first level to a second level, the reference signal generator includes at least three resistors coupled in series, a first switch is coupled in parallel to one of three resistors, and the first switch is turned on/off according to the second signal. In addition, the counter further includes a second toggle flipflop including a first input terminal receiving the signal of the first level and a second input terminal receiving the first signal and is synchronized with a second point of time of the first signal to generate a third signal in response to the signal of the first level, the latch unit further includes a second D flipflop including a first input terminal receiving the third signal and a second input signal receiving the control signal, the second D flipflop detects the third signal at the predetermined point of time to generate a fourth signal corresponding to a level of the third signal, the reference signal generator further includes a second resistor coupled in series to the at least three resistors and further includes a second switching element coupled in parallel to the second resistor, and the second switching element is turned on/off according to the fourth signal. In this case, the first point of time is rising edge timing of the first clock signal, a second point of time is rising edge timing of the first signal, the first toggle flipflop inverts a current output state of the first signal in response to the signal of the first level at the first point of time, and the second toggle flipflop inverts a current output state of the third signal in response to the signal of the first level at the second point of time. The switch controller further includes a PWM oscillator for detecting a maximum value or a minimum value of the oscillator signal, determining the first cycle, and generating the PWM clock signal having the second cycle that is the same as the first cycle, generates the gate control signal for turning off the main switch when the detection signal reaches a level of the feedback signal, and generates the gate control signal for turning on the main switch at a first point of time where a level of the PWM clock signal is varied from a first level to a second level after the main switch is turned off. The switch controller includes a comparator for comparing the detection signal and the feedback signal, an SR flipflop for receiving an output signal of the comparator and the PWM clock signal, outputting a signal of a fourth level to a first output terminal when the output signal of the comparator is a third level, and generating a signal of a fifth level according to the PWM clock signal at the first point of time, and a logic operation unit for receiving an output signal of the SR flipflop and the PWM clock signal and performing a logic operation of the input signal, and the switch controller generates the gate control signal for turning on the main switch according to a signal output by the logic operation unit when the two input signals are sixth levels. In this case, the first, third, and fourth levels are high levels, and the second, fifth, and sixth levels are low levels.

DETAILED DESCRIPTION

In the following detailed description, only certain embodiments are shown and described, simply by way of illustration. As those skilled in the art would realize, the described embodiments may be modified in various different ways, all without departing from the spirit or scope of the present invention. Accordingly, the drawings and description are to be regarded as illustrative in nature and not restrictive. Like reference numerals designate like elements throughout the specification.

Throughout this specification and the claims that follow, when it is described that an element is "coupled" to another element, the element may be "directly coupled" to the other element, or "electrically coupled" to the other element through a third element.

Figure 1:
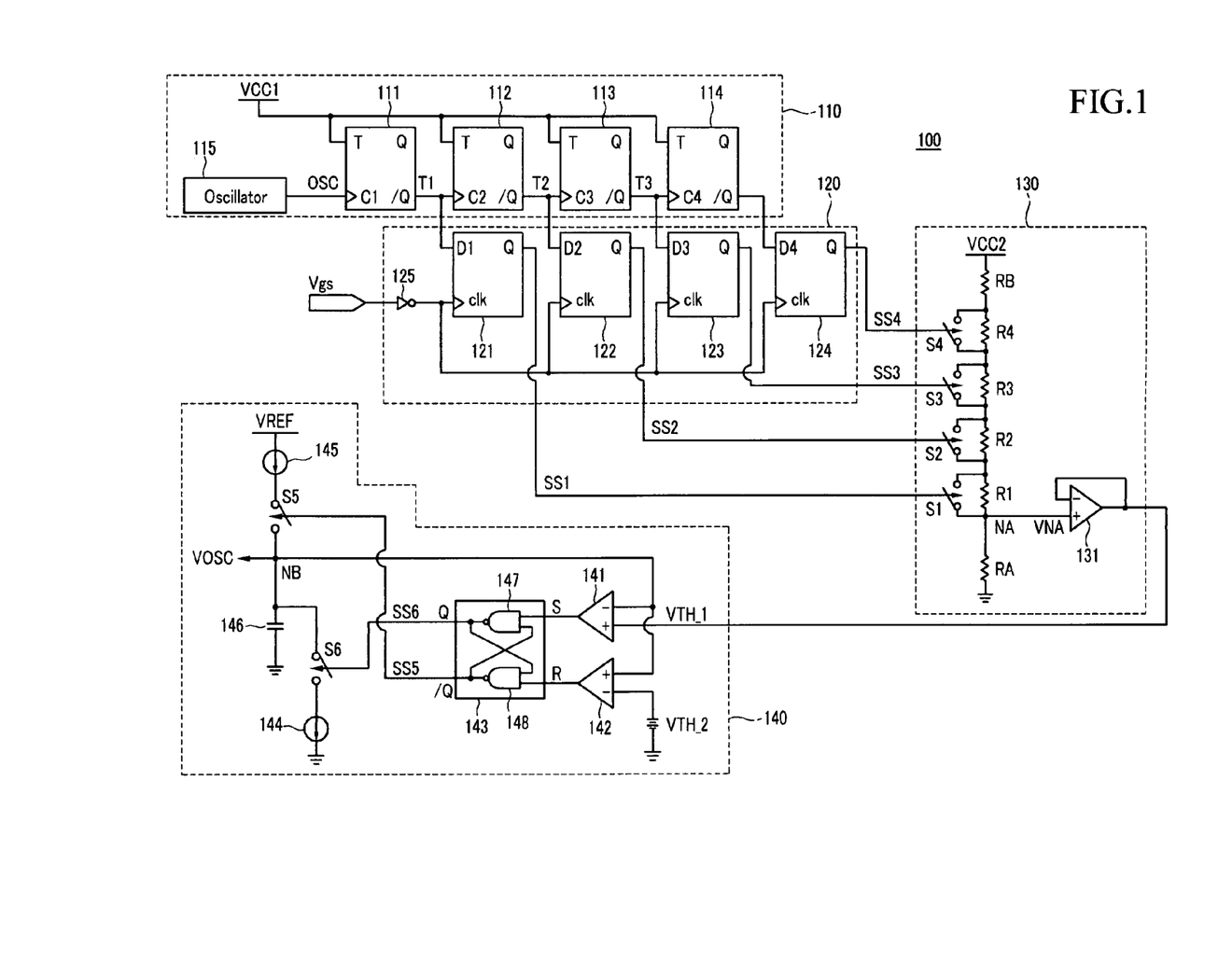
FIG. 1 is a diagram of a frequency modulation device.

FIG. 1 is a diagram of a frequency modulation device 100, which can include a counter 110, a latch unit 120, a reference signal generator 130, and a pulse width modulation (PWM) oscillator 140.

The counter 110 can include four toggle flipflops 111-114, a power source VCC1, and an oscillator 115. While an embodiment was illustrated with four toggle flipflops, but it is not limited thereto. In embodiments, where the reference signal generator 130 generates a first reference voltage VTH_1 having 16 levels, 4-bit data are required to control respective switching elements S1-S4, and therefore the counter 110 includes four toggle flipflops. In embodiments, where the first reference voltage VTH_1 has 32 levels, 5-bit data are required, and the counter 110 may include 5 toggle flipflops. The toggle flipflops 111-114 are synchronized with rising edge timing of a signal input to their respective clock terminals C1 to C4. The flipflops 111-114 maintain an output signal at an output terminal Q when a signal transmitted to an input terminal T has a low level corresponding to a logic value "0". When the signal transmitted to the input terminal T at the rising edge timing of the signal input to clock terminals C1-C4 has a high level corresponding to a logic value "1", the toggle flipflops 111-114 invert the state of the output signal of the an inverted output terminal /Q. In other words, when a current output signal has a predetermined high level, the high level is converted to a lower level at the rising edge of the signal inputted at the clock terminal. Naturally, an output signal of an inverted output terminal /Q is opposite to the output signal of the output terminal Q. When a voltage level of the power source VCC1 is a high level corresponding to the logic value "1", since the input terminals T of the toggle flipflops 111-114 are coupled to the power source VCC1, the toggle flipflops 111-114 invert the output signal at the rising edge timing of the signal input to the clock terminals C1-C4 and output it at the inverted output terminal /Q.

The oscillator 115 can output a clock signal OSC having a predetermined period. The clock signal OSC is input to the clock terminal C1 of the toggle flipflop 111. Since the inverted output terminal /Q of the toggle flipflop 111 is coupled to the clock terminal C2 of the toggle flipflop 112, a signal T1 output from the inverted output terminal /Q of the toggle flipflop 111 functions as a clock signal of the toggle flipflop 112. The inverted output terminal /Q of the toggle flipflop 112 is coupled to the clock terminal C3 of the toggle flipflop 113 and the inverted output terminal /Q of the toggle flipflop 113 is coupled to the clock terminal C4 of the toggle flipflop 114. In short, the output signals of the inverted output terminal /Q of one toggle flipflop can function as a clock signal of a subsequent toggle flipflop.

The output signals T1 to T4 of the inverted output terminals /Q of the respective toggle flipflops 111-114 can be input to input terminals D1-D4 of D flipflops 121-124 of the latch unit 120.

The latch unit 120 can include the four D flipflops 121-124 and an inverter 125. The latch unit 120 may include four D flipflops 121-124 to generate the first reference voltage VTH_1 having 16 levels. When the first reference voltage VTH_1 has 32 levels, the latch unit 120 may include 5 D flipflops. In different embodiments, the number of D flipflops of the latch unit 120 and the number of toggle flipflops of the counter 110 are determined according to the number of levels of the first reference voltage VTH_1. In detail, the first reference voltage VTH_1 may have levels corresponding to $2^n$, and in this case, the number of toggle flipflops of the counter 110 and the number of D flipflops of the latch unit 120 can be n. For example, the frequency modulation device may generate the first reference voltage VTH_1 having two levels. In this case, the number of toggle flipflops of the counter 110 can be 1, and the number of D flipflops of the latch unit 120 also 1.

The reference signal generator 130 can also include a resistor RA, a resistor RB, and one or more other resistors, and a switching element coupled in parallel to the one or more other resistors. A control signal of a device using the frequency modulation device can be input to an input terminal of the inverter 125. The control signal can have an irregular, or variable duty ratio. In further detail, the control signal may determine an operational frequency of the device using the frequency modulation device. A gate control signal Vgs can be input to the inverter 125 to control the switching operation of the switch of the SMPS. The inverter 125 inverts a phase of the gate control signal Vgs and transmits it to each clock terminal clk of the D flipflops 121-124. The D flipflops 121-124 can output a signal of a high level corresponding to the logic value "1" to the output terminal Q when a signal input to the clock terminal clk is at the rising edge timing and the signal input to the respective input terminals D1-D4 of the D flipflops 121-124 has the high level corresponding to the logic value "1". In addition, the D flipflops 121-124 can output a signal of a low level corresponding to the logic value "0" to the output terminal Q when the signal input to the clock terminal clk is at the rising edge timing and the signal input to the respective input terminals D1-D4 of the D flipflops 121-124 has the low level corresponding to the logic value "0".

In these embodiments, the output signal of the inverter is at the rising edge timing in synchronization with falling edge timing of the gate control signal Vgs. The output signal of the inverter 125 is input to the respective clock terminals clk of the D flipflops 121-124, and levels of respective output signals SS1-SS4 of the D flipflops 121-124 are determined according to levels of the signals T1-T4, also input to the respective input terminals D1-D4 of the D flipflops 121-124 at the rising edge timing of the output signal of the inverter 125. The switching elements S1-S4 of the reference signal generator 130 are turned on/off according to the signals SS1-SS4. The switching elements S1-S4 can be turned on by the high levels of the signals SS1-SS4, and are turned off by the low level of the signals SS1-SS4.

Continuing the description of the reference signal generator 130, it can include a power source VCC2, the resistors RA, RB, four resistors, labeled R1-R4, the switching elements S1 to S4, coupled in parallel to the corresponding resistors R1 to R4, and a buffer 131. Resistance values of the resistors RA, RB, and R1-R4 can be different. In the reference signal generator 130, the resistors RA, RB, R1-R4 can be coupled in series. A voltage of a node NA where the resistor RA and the resistor R12 are electrically coupled is output as the first reference voltage VTH_1. In this case, as described, the number of resistors is determined according to the number of levels of the first reference voltage VTH_1. In this embodiment, the first reference voltage VTH_1 has $2^4=16$ levels, but it is not limited thereto. The level of the first reference voltage VTH_1 is determined according to which switching element among the switching transistors S1 to S4 is turned on. In further detail, a voltage VNA of the node NA is the same as a voltage supplied to the resistor RA when a voltage of the power source VCC2 is divided and supplied to the plurality of resistors. In this case, since a voltage is not supplied to a resistor coupled in parallel to the turn-on switching element among the switching elements S1-S4, the voltage supplied to the resistor RA varies. When the switching elements S1-S4 are turned on, the resistor RB and the resistor RA are substantially coupled between the power source VCC2 and a ground terminal, and therefore the voltage VNA has a maximum level of (VCC2*RA/(RA+RB)). When the switching elements S1-S4 are turned off, the voltage VNA has a minimum level of (VCC2*RA/(RA+RB+R1+R2+R3+R4)). In other cases, the voltage VNA has a level between the maximum level and the minimum level, determined by which of the switching elements S1-S4 is turned on.

The voltage VNA can be transmitted through the buffer 131 and outputted as the first reference voltage VTH_1 to the PWM oscillator 140. Since the voltage VNA is substantially the same as the first reference voltage VTH_1, the first reference voltage VTH_1 has a level that is determined according to which of the switching elements S1-S4 is turned on.

The PWM oscillator 140 can include a first comparator 141, a second comparator 142, an SR flipflop 143, a power source VREF, a current source 145, a sync-current source 144, two switching elements S5 and S6 and a capacitor 146. The first reference voltage VTH_1 is input to a non-inverted terminal "+" of the first comparator 141. An oscillator signal VOSC of a node NB where the capacitor 146 and the switching element S5 are electrically coupled is input to an inverted terminal "−" of the first comparator 141. The oscillator signal VOSC can be a final output voltage of the frequency modulation device 100. A cycle of the oscillator signal VOSC may vary irregularly. A second reference voltage VTH_2 can be input to an inverted terminal "−" of the second comparator 142, and the oscillator signal VOSC is input to a non-inverted terminal "+". The first reference voltage VTH_1 and the second reference voltage VTH_2 are respectively the maximum voltage and the minimum voltage of the oscillator signal VOSC.

A set terminal S of the SR flipflop 143 can be coupled to an output terminal of the first comparator 141, and a reset terminal R to an output terminal of the second comparator 142. The SR flipflop 143 may include NAND gates 147 and 148. The NAND gate 147 includes two input terminals, and an output signal of the first comparator 141 and an output signal of an inverted output terminal /Q of the SR flipflop 143 are respectively input to the input terminals. The NAND gate 148 includes two input terminals, and an output signal of the second comparator 142 and an output signal of the output terminal Q of the SR flipflop 143 are input to the input terminals. A truth table of the SR flipflop 143 is given as Table 1.

TABLE 1

| Input | | Output | |
|---|---|---|---|
| S | R | Q | /Q |
| 0 | 0 | 1 | 1 |
| 0 | 1 | 1 | 0 |
| 1 | 0 | 0 | 1 |
| 1 | 1 | No variation | |

In Table 1, "0" corresponds to a low level, and "1" corresponds to a high level. As shown in Table 1, when a signal input to the set terminal S is the high level and a signal input to the reset terminal R is the low level, a signal SS6 of the low level is output from the output terminal Q. In this case, a signal SS5 output from the inverted output terminal /Q is the high level. In addition, when the signal input to the set terminal S is the low level and the signal input to the reset terminal R is the high level, the signal SS6 of the high level is output from the output terminal Q. In this case, the signal SS5 output from the inverted output terminal /Q is the low level.

The switching element S5, coupled between the current source 145 and the capacitor 146, can be turned on by the signal SS5 of the high level, and off by the signal SS5 of the low level. The switching element S6 coupled between the sync-current source 144 and the capacitor 146, can be turned on by the signal SS6 of the high level, and is turned off by the signal SS6 of the low level. When the switching element S5 is turned on, a current of the current source 145 may flow to the capacitor 146, and the capacitor 146 is charged. Accordingly, a level of the oscillator signal VOSC can increase. In this case, a slope of an increasing level of the oscillator signal VOSC may have a predetermined value since a value of capacitance of the capacitor 146 and the current of the source-current source 145 have predetermined values. Since the output signal of the first comparator 141 can be the low level and the output signal of the second comparator 142 is the high level when the oscillator signal VOSC reaches the first reference voltage VTH_1, the signal SS6 of the high level is transmitted from the output terminal Q to the switching element S6 and therefore the switching element S6 is turned on. The signal SS5 of the low level is transmitted from the inverted output terminal /Q to the switching element S5, and therefore the switching element S5 is turned off. Thereby, the capacitor 146 can be discharged by the sync-current source 144, and the level of the oscillator signal VOSC can decrease. In this case, a slope of a decreasing oscillator signal VOSC has a predetermined value since the value of capacitance of the capacitor 146 and the current of the sync-current source 144 have predetermined values.

Figure 2:
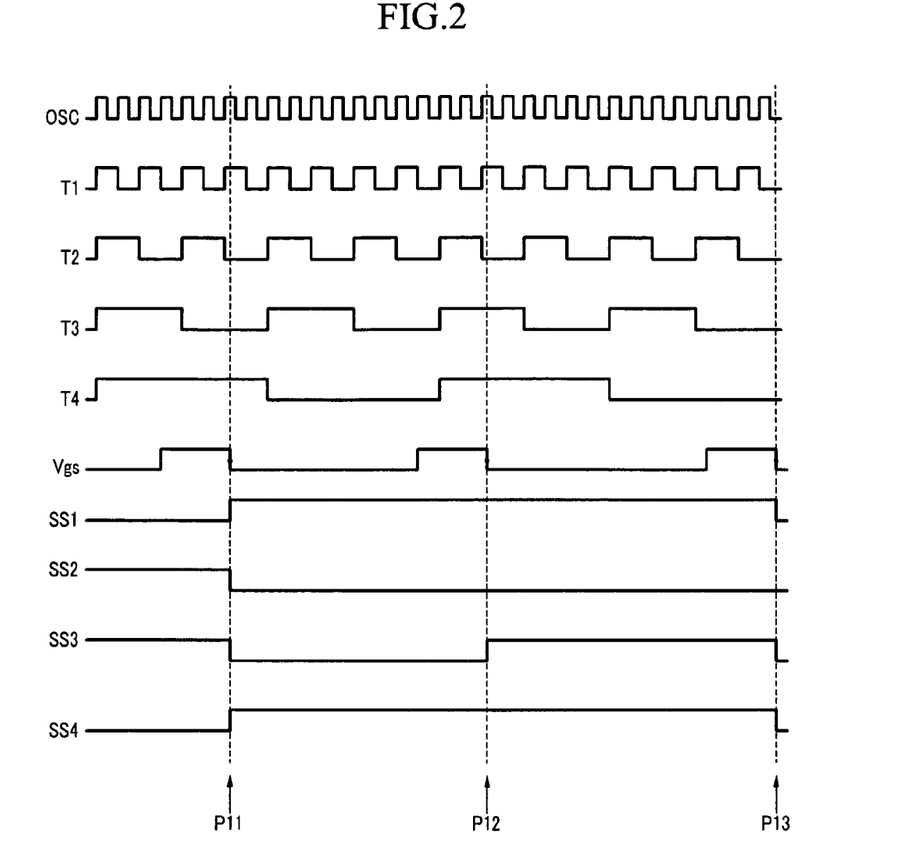
FIG. 2 is a diagram representing a signal waveform of the frequency modulation device.
Figure 3:
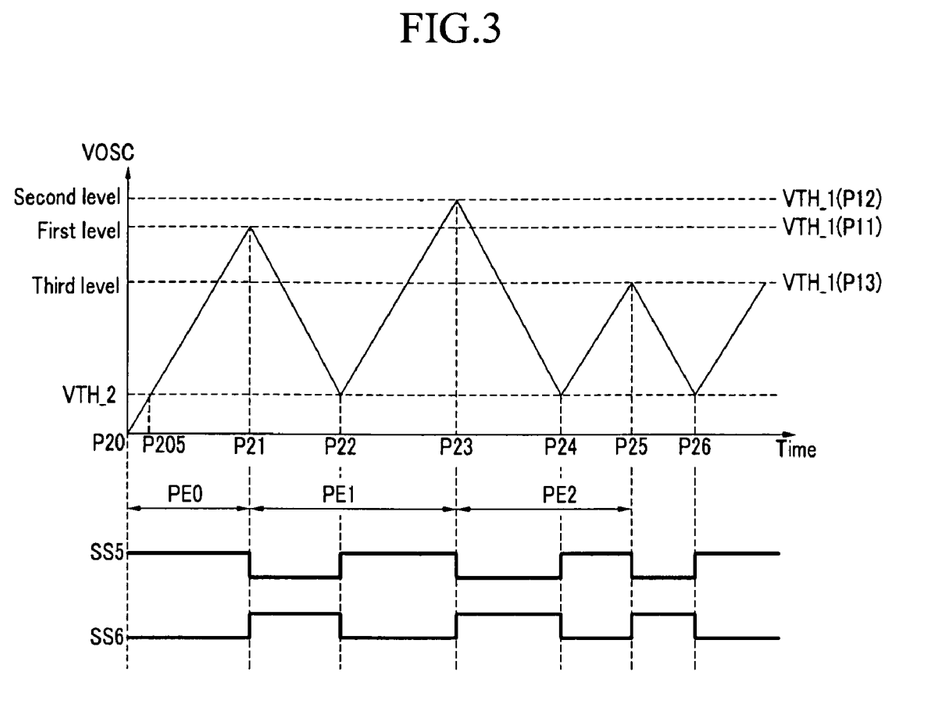
FIG. 3 is a diagram representing a waveform of an oscillator signal VOSC.

FIG. 2 is a diagram representing a signal waveform of the frequency modulation device in some embodiments. FIG. 3 is a diagram representing a waveform of the oscillator signal VOSC in some embodiments.

The toggle flipflops 111-114 can invert current output signals at the rising edge timing of the signals input to the clock terminals C1-C4. A level of the signal T1 is converted from the high level to the low level and from the low level to the high level at the rising edge of the clock signal OSC, referred to as rising edge timing. A level of the signal T2 is converted from the high level to the low level and from the low level to the high level at the rising edge of the signal T1 input to the clock terminal C2 of the toggle flipflop 112. A level of the signal T3 is converted from the high level to the low level and from the low level to the high level at the rising edge of the signal T2 input to the clock terminal C3 of the toggle flipflop 113. Also, a level of the signal T4 is converted from the high level to the low level and from the low level to the high level at the rising edge of the signal T3 input to the clock terminal C4 of the toggle flipflop 114. The signals T1-T4 are respectively input to the input terminals D1 to D4 of the D flipflops 121-124.

The D flipflops 121-124 generate the signals SS1-SS4 at the falling edge timing of the gate control signal Vgs input to the clock terminals clk. That is, a level of the signal SS1 is converted from the low level to the high level according to the signal T1 of the high level at a time P11 that is the falling edge timing of the gate control signal Vgs. A level of the signal SS2 is converted from the high level to the low level according to the signal T2 of the low level at the time P11. A level of the signal SS3 is converted from the high level to the low level according to the signal T3 of the low level at the time P11. A level of the signal SS4 is converted from the low level to the high level according to the signal T4 of the high level at the time P11. Accordingly, the switching element S1 and the switching element S4 are turned on by the signals SS1 and SS4 of the high level, and the first reference voltage VTH_1 may assume a first level (VCC2*RA/(RA+RB+R2+R3)). Thereby, the first reference voltage VTH_1 of the first level is transmitted to the non-inverted terminal "+" of the first comparator 141, and the oscillator signal VOSC increases to the first level, which will be described with reference to FIG. 3.

FIG. 3 illustrates that that the level of the oscillator signal VOSC may start to increase from a time P20. From the time P20 to a time P205, the input signal of the set terminal S of the SR flipflop 143 is the high level, the input signal of the reset terminal R is the low level, the output signal SS6 output from the output terminal Q of the SR flipflop 143 is the low level, and the output signal SS5 output from the inverted output terminal /Q of the SR flipflop 143 is the high level. Thereby, the switching element S5 may be turned on, the switching element S6 may be turned off, the capacitor 146 may be charged by the source-current source 145, and the level of the oscillator signal VOSC may increase. From the time P205 to a time P21, the input signal of the set terminal S of the SR flipflop 143 may be the high level, the input signal of the reset terminal R may be the high level, the output signal of the SR flipflop 143 may be maintained at a predetermined level, and the level of the oscillator signal VOSC may be continuously increased. In this case, during a period PE0, the signal SS6 output from the output terminal Q of the SR flipflop 143 is the low level, and the signal SS5 is the high level. Accordingly, the switching element S5 can be turned on, and the switching element S6 can be turned off. Thereby, during the period PE0, the capacitor 146 is charged by the source-current source 145, and the level of the oscillator signal VOSC increases.

When the increased oscillator signal VOSC reaches the first reference voltage VTH_1 at the time P21, the output signal of the first comparator 141 may be the low level. The output signal of the second comparator 142 can be the high level after the time P205. Thereby, the output signal SS5 of the SR flipflop 143 can be the low level, the output signal SS6 can be the high level, the switching element S5 can be turned off, and the switching element S6 can be turned on. The capacitor 146 can be discharged to a ground terminal by the current of the sync-current source 144, and the level of the oscillator signal VOSC may decrease. When the level of oscillator signal VOSC starts to decrease, the output signal of the first comparator 141 becomes the high level and the SR flipflop 143 is maintained at a current output signal level. When the decreased oscillator signal VOSC reaches the second reference voltage VTH_2 at the time P22, the output signal of the second comparator 142 can be the low level, the output signal SS5 of the SR flipflop 143 can be the high level, the output signal SS6 can be the high level, the switching element S5 can be turned on, and the switching element S6 can be turned off. Thereby, the level of the oscillator signal VOSC starts to increase.

A time P12 shown in FIG. 2 is a random time during the period PE1 shown in FIG. 3. The switching element S1, the switching element S3, and the switching element S4 can be respectively turned on by the signal SS1, the signal SS3, and the signal SS4 of the high level at the time P12. Thereby, the first reference voltage VTH_1 can become a second level (VSS2*RA/(RA+RB+R2)). After the time P22 shown in FIG. 3, the level of the oscillator signal VOSC can increase to the second level. As described, when the oscillator signal VOSC reaches the second level at a time P23, the first comparator 141 can output the signal of the low level, the second comparator 142 can output the signal of the high level, and the SR flipflop 143 can output the signal SS6 of the high level and the signal SS5 of the low level. Thereby, the switching element S6 is turned on, and the oscillator signal VOSC can be decreased by the current of the sync-current source 144. When the level of the oscillator signal VOSC starts to decrease, the output signal of the first comparator 141 can become the high level, the output signal of the second comparator 142 can be maintained at the high level, and the SR flipflop 143 can be maintained at a current output level. When the decreased oscillator signal VOSC reaches the second reference voltage VTH_2 at a time P24, the output signal of the second comparator 143 can be the low level, and the SR flipflop 143 may output the signal SS6 of the low level and the signal SS5 of the high level. Thereby, the switching element S5 is turned on, the switching element S6 is turned off, and the level of the oscillator signal VOSC starts to increase after the time P24. Since the oscillator signal VOSC is increased to be greater than the second reference voltage VTH_2, the second comparator 142 may output the signal of the high level. In this case, since the first comparator 141 outputs the signal of the high level, the SR flipflop 143 is maintained at a current output level.

Referring to FIG. 2, a time P13 is a random time during a period PE2 shown in FIG. 3. The signals SS1, SS2, SS3, and SS4 can have the low levels at the time P13. Correspondingly, all the switching elements S1 to S4 can be turned off, and the first reference voltage VTH_1 becomes a third level (VSS2∗RA/(RA+RB+R1+R2+R3+R4)). After the time P24 shown in FIG. 3, the level of the oscillator signal VOSC may increase to the third level. As described, when the oscillator signal VOSC reaches the third level at a time P25, the first comparator 141 can output the signal of the low level, the second comparator 142 can output the signal of the high level, and the SR flipflop 143 can output the signal SS6 of the high level and the signal SS5 of the low level. Thereby, the switching element S6 may be turned on, and the level of the oscillator signal VOSC can decrease by the current of the sync-current source 144. When the oscillator signal VOSC starts to decrease, the output signal of the first comparator 141 can become the high level, the output signal of the second comparator 142 is maintained at the high level, and the SR flipflop 143 is maintained at a current output level. When the decreased oscillator signal VOSC reaches the second reference voltage VTH_2 at a time P26, the output signal of the second comparator 143 can become the low level, and the SR flipflop 143 may output the signal SS6 of the low level and the signal SS5 of the high level. Thereby, the switching element S5 can be turned on, the switching element S6 turned off, and the level of the oscillator signal VOSC can start to increase after the time P26. Since the oscillator signal VOSC can be increased to be greater than the second reference voltage VTH_2, the second comparator 142 may output the signal of the high level. In this case, since the first comparator 141 outputs the signal of the high level, the SR flipflop 143 is maintained at a current output level.

To repeatedly perform the above operation, the cycle can be irregularly varied to modulate a frequency. In further detail, the period PE1 and period PE2 can respectively correspond to one cycle. Since the slopes of increasing and decreasing oscillator signal VOSC may have predetermined values, the period PE1 can be different from the period PE2 when the first reference voltage VTH_1 varies. That is, when one cycle is set to be a period where the oscillator signal VOSC increases from the second reference voltage VTH_2 to the first reference voltage VTH_1 after decreasing from the first reference voltage VTH_1 to the second reference voltage VTH_2, the first reference voltage VTH_1 can irregularly vary according to a variation of the falling edge timing of the gate control signal Vgs, the cycle can vary continuously.

In general, in the SMPS, since a DC-link voltage, generated by half-wave rectifying an input AC voltage has a ripple characteristic, a switch turn-off timing of the SMPS can vary. In addition to the ripple characteristic of the DC-link voltage, the switch turn-off timing of the SMPS may vary by a variation of a load connected to the SMPS and deviation in a control integrated circuit chip for controlling the SMPS. Accordingly, the turn-off timing variation can be irregular. In some embodiments, the frequency modulation device may irregularly modulate a frequency, and the SMPS uses the frequency modulation device. The SMPS using the frequency modulation device according to an embodiment to modulate the frequency will now be described.

A time P13 shown in FIG. 2 is a predetermined time during a period PE2 shown in FIG. 3, and the signal SS1, the signal SS2, the signal SS3, and the signal SS4 have the low levels at the time P13. Thereby, all the switching elements S1 to S4 are turned off, and the first reference voltage VTH_1 becomes a third level (VSS2∗RA/(RA+RB+R1+R2+R3+R4)). After the time P24 shown in FIG. 3, the level of the oscillator signal VOSC increases to the third level. As described, when the oscillator signal VOSC reaches the third level at a time P25, the first comparator 141 outputs the signal of the low level, the second comparator 142 outputs the signal of the high level, and the SR flipflop 143 outputs the signal SS6 of the high level and the signal SS5 of the low level. Thereby, the switching element S6 is turned on, and the level of the oscillator signal VOSC decreases by the current of the sync-current source 144. When the oscillator signal VOSC starts to decrease, the output signal of the first comparator 141 becomes the high level, the output signal of the second comparator 142 is maintained at the high level, and the SR flipflop 143 is maintained at a current output level. When the decreased oscillator signal VOSC reaches the second reference voltage VTH_2 at a time P26, the output signal of the second comparator 143 becomes the low level, and the SR flipflop 143 outputs the signal SS6 of the low level and the signal SS5 of the high level. Thereby, the switching element S5 is turned on, the switching element S6 is turned off, and the level of the oscillator signal VOSC starts to increase after the time P26. Since the oscillator signal VOSC is increased to be greater than the second reference voltage VTH_2, the second comparator 142 outputs the signal of the high level. In this case, since the first comparator 141 outputs the signal of the high level, the SR flipflop 143 is maintained at a current output level.

To repeatedly perform the above operation, the cycle is irregularly varied to modulate a frequency. In further detail, the period PE1 and period PE2 respectively correspond to one cycle. Since the slopes of increasing and decreasing the oscillator signal VOSC have the predetermined values, the period PE1 is different from the period PE2 when the first reference voltage VTH_1 varies. That is, when one cycle is set to be a period where the oscillator signal VOSC increases from the second reference voltage VTH_2 to the first reference voltage VTH_1 after decreasing from the first reference voltage VTH_1 to the second reference voltage VTH_2, the first reference voltage VTH_1 irregularly varies according to a variation of the falling edge timing of the gate control signal Vgs, so the cycle continuously varies. In general, in the SMPS, since a DC-link voltage generated by half-wave rectifying an input AC voltage has a ripple characteristic, switch turn-off timing of the SMPS varies. In addition to the ripple characteristic of the DC-link voltage, the switch turn-off timing of the SMPS varies by a variation of a load connected to the SMPS and deviation in a control integrated circuit chip for controlling the SMPS. Accordingly, the turn-off timing variation is irregular. In some embodiments, the frequency modulation device may irregularly modulate a frequency, and the SMPS uses the frequency modulation device. The SMPS using the frequency modulation device in an embodiment to modulate the frequency will now be described.

In the described embodiments the frequency modulation device can irregularly vary the first reference voltage VTH1 and the cycle. In other embodiments this may not be the case. The second reference voltage VTH_2 may be varied by using the reference signal generator 130.

In the described embodiments the reference signal generator 130 is used to vary the first reference voltage VTH_1. However, in other embodiments a plurality of current sources may be used to generate the first reference voltage.

Figure 4:
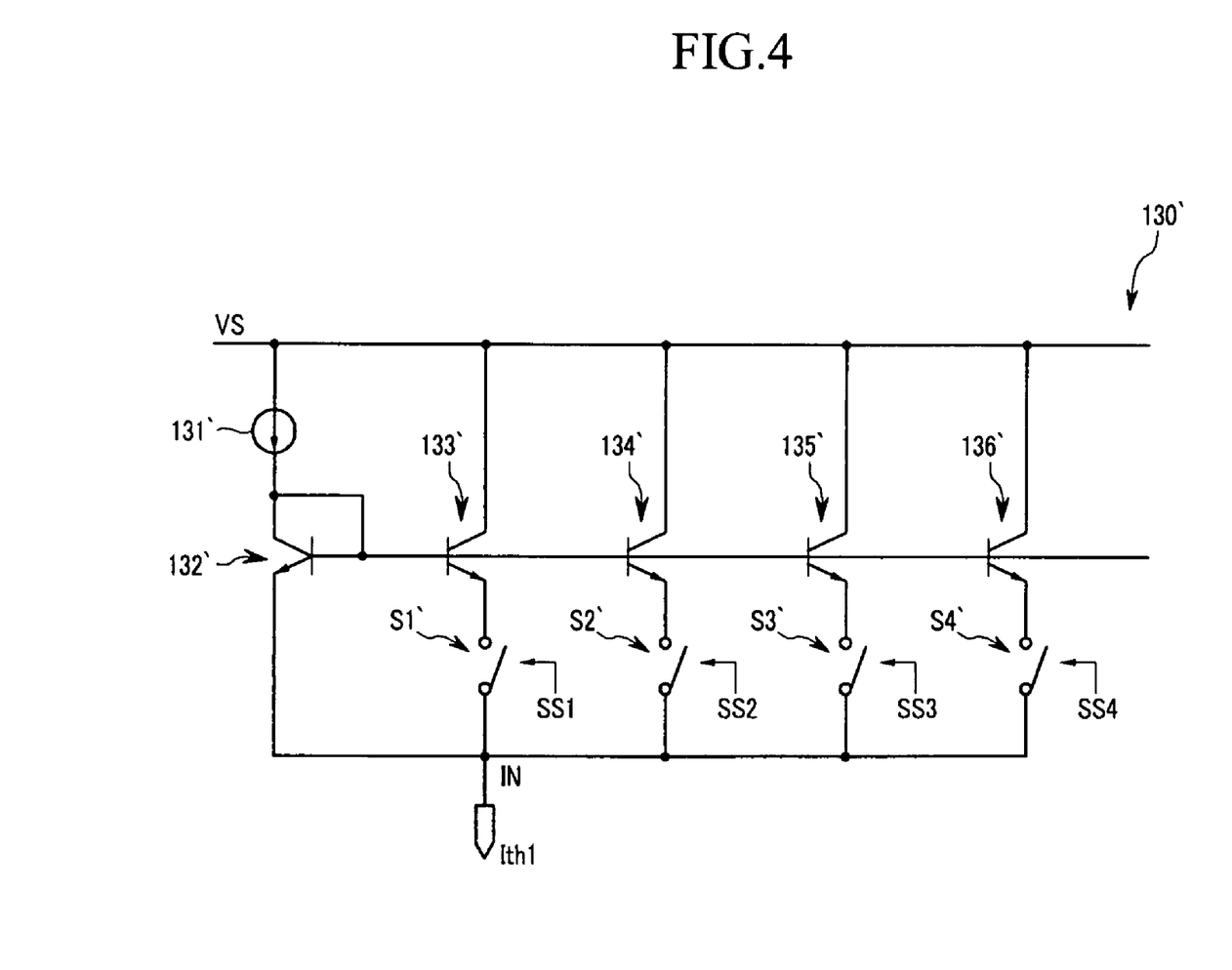
FIG. 4 is a diagram of a frequency modulation device.

FIG. 4 is a diagram of a reference signal generator 130' in the frequency modulation device second embodiment. The reference signal generator 130' may use a current mirror circuit to copy currents of a current source 131' with different ratios and generate a reference current Ith1. In further detail, ratios of length to width of respective channels of 5 bipolar junction transistors 132' to 136' can be established to have different values. Thereby, values of currents flowing through the 5 bipolar junction transistors 132' to 136' may be different. Switching elements S1' to S4' can be respectively coupled between emitters of four bipolar junction transistors 133' to 136' and node IN where the reference current Ith1 is output. The reference current Ith1 can vary according to switches which are turned on among the switching elements S1' to S4' and the number of turned-on switches.

When the reference signal generator 130' is used, the PWM oscillator 140 may further include a capacitor that is charged by the reference current Ith1 to generate the first reference voltage VTH_1. The capacitor can be coupled to the non-inverted terminal of the first comparator 141 and is charged by the reference current Ith1.

Figure 5:
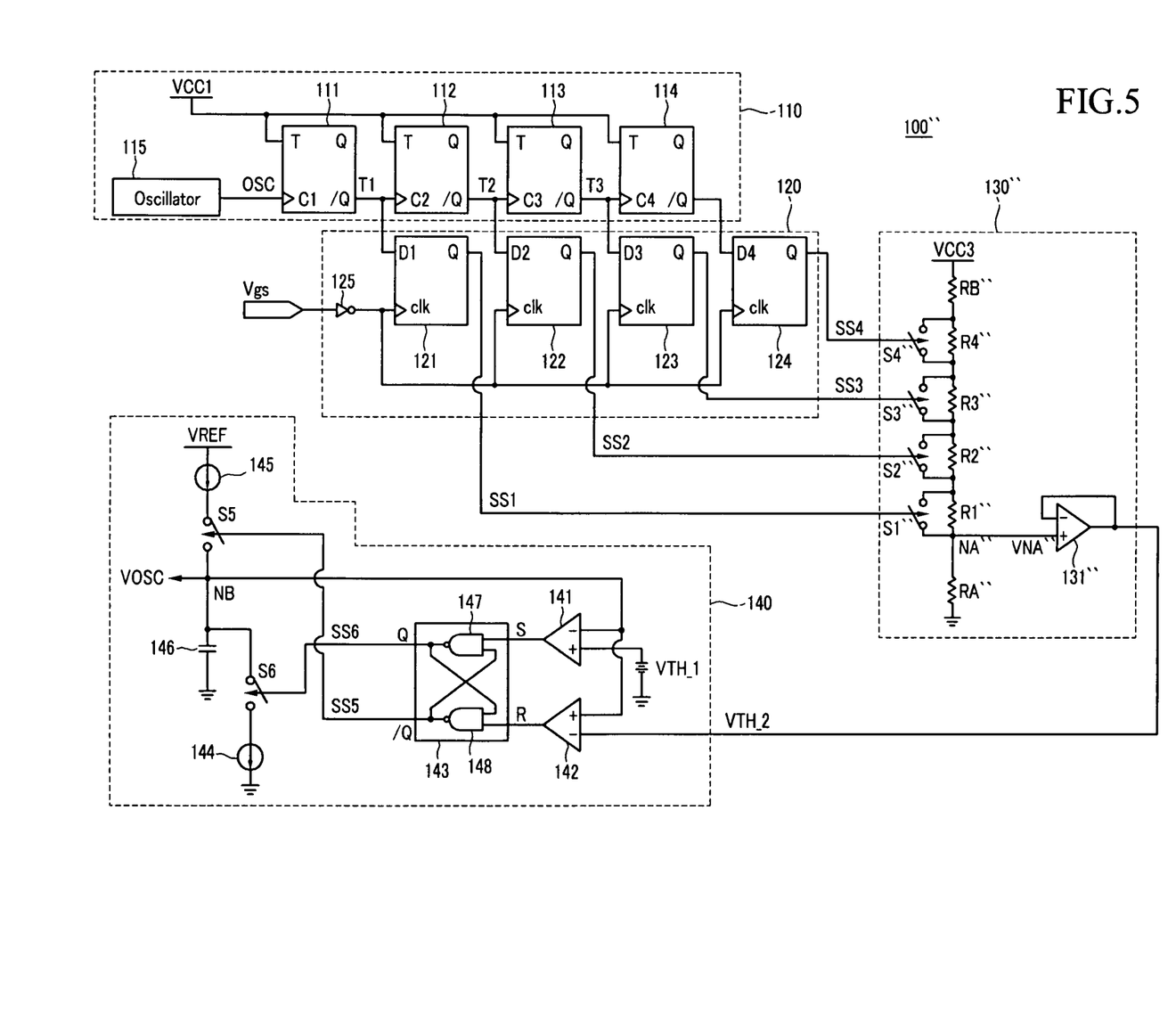
FIG. 5 is a diagram of a frequency modulation device.

FIG. 5 is a diagram of a frequency modulation device 100" including a configuration for generating the second reference voltage VTH_2 according to a third embodiment. Hereinafter, elements for performing the same functions as the above embodiments are denoted by the same reference numerals.

In this third embodiment of the frequency modulation device, a voltage of a power source VCC2" can be lower than the voltage of the power source VCC2. The power source VCC2" can generate the second reference voltage VTH_2. Values of a plurality of resistors RA", RB", and R1" to R4" can be appropriately varied to change the second reference voltage VTH_2, whose functions can be the same as above. A plurality of switching elements S1" to S4" can be turned on in response to the high level of the signals SS1 to SS4, and a voltage VNA" of a node NA can be input as the second reference voltage VTH_2 to the inverted terminal "−" of the second comparator 142 of the PWM oscillator 140 through a buffer 131" according to the number of switching elements among the switching elements S1" to S4", which are turned on.

The reference signal generator 130' shown in FIG. 4 may be used to generate the second reference voltage VTH_2.

Figure 6:
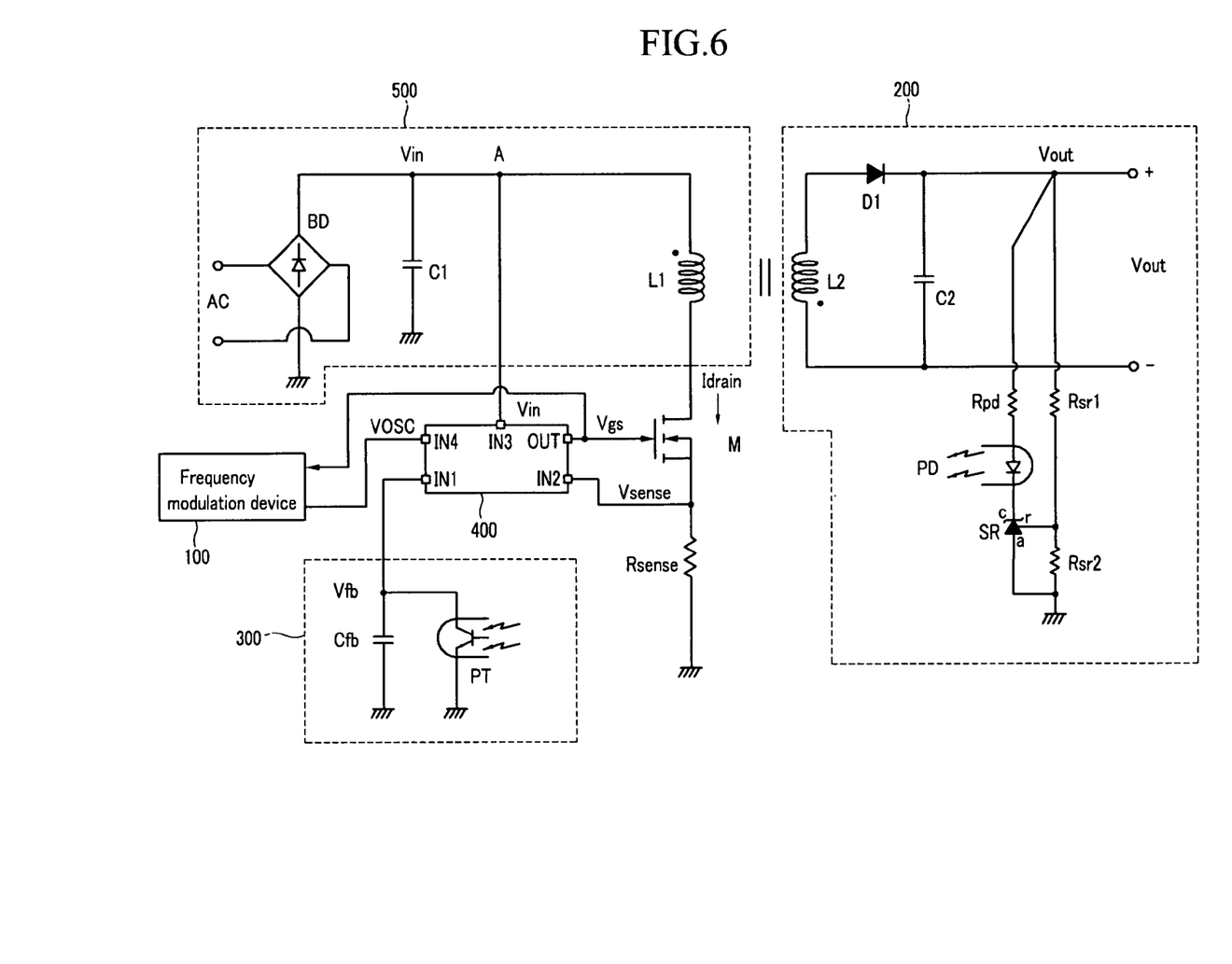
FIG. 6 is a diagram of a switching mode power supply (SMPS).

FIG. 6 is a diagram of the SMPS according to a fourth embodiment. In this fourth embodiment the SMPS can include a power supply unit 500, an output unit 200, a feedback circuit unit 300, a switch controller 400, a main switch M, and a sensing resistor Rsense. The SMPS of the present embodiment may include one of the frequency modulation devices 100, 100', and 100". In the fourth embodiment the SMPS including the frequency modulation device 100 will be described. A person of ordinary skill in the art may easily substitute the frequency modulation device 100 by one of the frequency modulation devices 100' or 100".

A terminal of the main switch M can be coupled to a primary coil L1 of a transformer, and another terminal thereof to a terminal of the sensing resistor Rsense. Another terminal of the sensing resistor Rsense can be grounded. The main switch M can be an n-channel metal-oxide semiconductor field-effect transistor (MOSFET). The main switch M can include a gate electrode as a control electrode, a drain electrode and a source electrode. The gate electrode of the main switch M can be coupled to an output terminal OUT of the switch controller 400. The drain electrode of the main switch M can be coupled to the primary coil L1, and the source electrode to the terminal of the sensing resistor Rsense. In other embodiments, various transistors may be used as the main switch M. The terminal of the sensing resistor Rsense can be coupled to the source electrode of the main switch M and its other terminal can be grounded. When the main switch M conducts, a sensing voltage Vsense corresponding to a drain current Idrain flowing through the main switch M can be generated in the sensing resistor Rsense. In the present embodiment the sensing voltage Vsense can be generated by using the sensing resistor Rsense to measure the drain current Idrain. In other embodiments, other current sensors may be used.

The power supply unit 500 may include a wave bridge rectifier BD for rectifying an alternating current AC input, a capacitor C1 for smoothing a rectified voltage, and the primary coil L1 of the transformer coupled to an input voltage Vin. The power supply unit 500 may receive the input voltage Vin to supply power to a secondary coil of the transformer according to a duty of the main switch M, and therefore a predetermined output voltage Vout is output to the output unit 200. Here, the SMPS generates feedback information corresponding to the output voltage Vout to control a switching operation of the main switch M, thus regulating the output voltage Vout.

The output unit 200 may include a diode D1, a capacitor C2, a photodiode PD, a resistor Rpd, a shunt regulator SR, a resistor Rsr1, and a resistor Rsr2. An anode of the diode D1 can be coupled to the secondary coil L2 of the transformer, a terminal of the capacitor C2 can be coupled to an output terminal "+", and another terminal of the capacitor can be coupled to an output terminal "−". A terminal of the resistor Rpd can be coupled to the output terminal "+", and the other terminal of the resistor Rpd can be coupled to an anode of the photodiode PD. A cathode c of the shunt regulator SR can be coupled to a cathode of the photodiode PD, and an anode a thereof can be grounded. A terminal of the resistor Rsr1 can be coupled to the output terminal "+" and the resistor Rpd, and another terminal thereof can be coupled to a reference terminal r of the shunt regulator SR. A terminal of the resistor Rsr2 can be coupled to the reference terminal r of the shunt regulator SR, and another terminal thereof can be coupled to an anode a of the shunt regulator SR. A voltage Vsr of a node Nsr of the resistor Rsr1 and the resistor Rsr2 can be the reference voltage of the shunt regulator SR. When the main switch M conducts, power can be accumulated in the primary coil L1, and when the main switch M is interrupted, the power of the primary coil L1 can be transmitted to the secondary coil L2. In this case, a predetermined voltage can be induced to the secondary coil L2, and the output voltage Vout can be charged in the capacitor C2 coupled in parallel to the secondary coil L2. The voltage Vsr increases according to the output voltage Vout, and the shunt regulator SR conducts. Thereby, a current can flow through a path of the resistor Rpd, the photodiode PD, and the shunt regulator SR. The photodiode PD emits photons corresponding to the current. When a phototransistor PT forming a photocoupler with a photodiode in the feedback circuit unit 300 detects the photons, a current corresponding to the photons flows through the phototransistor PT. As described, the output unit 200 supplies power to a load and provides information corresponding to the output voltage Vout to the feedback circuit unit 300 to regulate the output voltage Vout.

The feedback circuit unit 300 may include the phototransistor PT forming the photocoupler along with the photodiode PD, and a capacitor Cfb coupled in parallel to the phototransistor PT. The photodiode PD can form the photocoupler with the phototransistor PT of the feedback circuit unit 300, and provide the information corresponding to the output voltage Vout to the feedback circuit unit 300. The phototransistor PT where the current flows according to the amount of photons from the photodiode PD may be equivalently shown as a dependant current source. The current corresponding to the output voltage Vout of the output unit 200 may flow in the phototransistor PT of the feedback circuit unit 300, a relatively large amount of current flows through the phototransistor PT when the output voltage Vout can be high, and therefore a feedback voltage Vfb charged in the capacitor Cfb can be reduced. When the output voltage Vout can be low, a relatively lesser amount of current flows through the phototransistor PT, and the feedback voltage Vfb charged in the capacitor Cfb can be increased. Accordingly, the information corresponding to the output voltage Vout can be detected by the feedback circuit unit 300 and can be input to the switch controller 400, and the information can be used to control the switching operation of the main switch M.

The switch controller 400 can include a feedback voltage input terminal IN1, a sensing voltage input terminal IN2, a first voltage input terminal IN3, an input terminal IN4, and the output terminal OUT. The input terminals IN1 and IN2 can receive the feedback voltage Vfb and the sensing voltage Vsense, respectively. The first voltage input terminal IN3 can be coupled to the power supply unit 500 to receive the first voltage Vin. In some embodiments, the first voltage Vin can be a voltage of a node A where the primary coil L1 and the capacitor C1 of the power supply 500 are electrically coupled. In other embodiments, the first voltage Vin may be a voltage of a node where the primary coil L1 and the main switch M are electrically coupled. The switch controller 400 can use the first voltage to generate a bias voltage. In this case, the bias voltage can be used to operate the switch controller 400. The input terminal IN4 can be coupled to the frequency modulation device 100, and the oscillator signal VOSC can be input to the input terminal IN4. The switch controller 400 may generate a PWM clock signal corresponding to a waveform cycle of the oscillator signal VOSC, and may irregularly vary the switching operation frequency.

Figure 7:
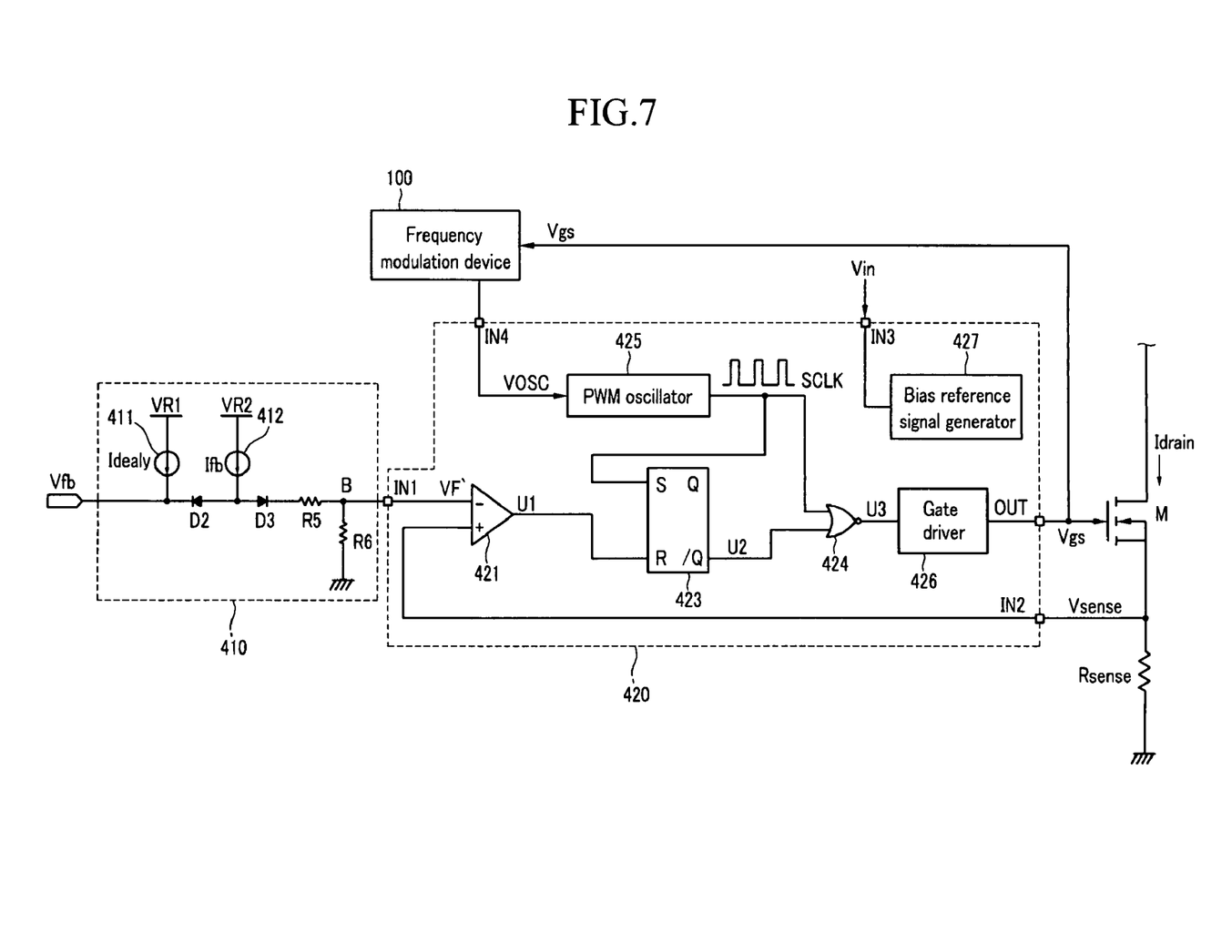
FIG. 7 is a diagram of a switch controller of an SMPS.

FIG. 7 is a diagram of an embodiment of the switch controller 400 of the SMPS. The switch controller 400 may include a feedback signal generator 410 and a PWM controller 420. The feedback signal generator 410 can include two diodes D2 and D3, two resistors R5 and R6, a current source Idelay 411, a current source Ifb 412, a power source VR1, and a power source VR2. The power source VR1 and the power source VR2 may generate the current source 411 and the current source 412. A cathode of the diode D2 can be coupled to a terminal of the capacitor Cfb shown in FIG. 4, and receives the feedback voltage Vfb. A current of the current source 411 may flow through the capacitor Cfb. An anode of the diode D2 and an anode of the diode D3 are coupled, and a current of the current source 412 flows to the diode D2 and the diode D3. A terminal of the resistor R5 can be coupled to a cathode of the diode D6, and another terminal of the resistor R5 can be coupled to a terminal of the resistor R6 and the non-inverted terminal "+" of the comparator 421 of the PWM controller 420. Another terminal of the resistor R6 can be grounded. A voltage generated when a current flowing through the diode D3 and then divided by the ratio of resistors R5 and R6 can be a feedback signal VF. The voltage of the feedback signal VF can be the same as a voltage divided from the feedback voltage Vfb in a resistance ratio of the resistor R5 and the resistor R6.

The PWM controller 420 may include the PWM comparator 421, an inverter 422, a PWM oscillator 425, a second SR flipflop 423, a NOR gate 424, a gate driver 426, and a bias reference signal generator 427.

The bias reference signal generator 427 can receive the voltage Vin to generate a bias voltage for operating the switch controller 400.

The PWM comparator 421 can receive the feedback signal VF and the sensing voltage Vsense to compare the feedback signal VF and the sensing voltage Vsense. The PWM comparator 421 may generate a signal U1 according to a result of the comparison. For example, the signal U1 can be a high level when the feedback signal VF is greater than the sensing voltage Vsense, and the signal U1 can be a low level when the feedback signal VF is lower than the sensing voltage Vsense.

The inverter 422 can invert the signal U1 to generate a signal U2 and transmit the signal U2 to a reset terminal R of the second SR flipflop 423.

The PWM oscillator 425 may use the oscillator signal VOSC to generate a PWM clock signal SCLK having a predetermined cycle. The PWM clock signal SCLK can be transmitted to a set terminal S of the second SR flipflop 423 and the NOR gate 424. The PWM oscillator 425 detects the oscillator signal VOSC, detects a time where the oscillator signal VOSC has a maximum value and a subsequent time where the oscillator signal VOSC has the maximum value, and determines a first period between the times as the cycle of the PWM clock signal SCLK. In addition, the PWM oscillator 425 detects a time where the oscillator signal VOSC has a minimum value and a subsequent time where the oscillator signal VOSC has the minimum value, and determines a second period between the times as the cycle of the PWM clock signal SCLK.

The maximum value of the oscillator signal VOSC varies according to the first reference voltage VTH_1, and the minimum value thereof varies according to the second reference voltage VTH_2. Accordingly, when the PWM oscillator 425 detects the maximum value and the minimum value of the oscillator signal VOSC and determines the cycle of the PWM clock signal SCLK accordingly, these cycles of the PWM clock signal SCLK will be different. Moreover, since the cycle of the oscillator signal VOSC waveform varies irregularly, the cycle of the PWM clock signal SCLK also varies irregularly. In the SMPS the gate control signal Vgs can be the high level at the falling edge timing of the PWM clock signal SCLK, and the main switch M can be turned on. Since the falling edge timing of the PWM clock signal SCLK varies irregularly when the cycle of the PWM clock signal SCLK varies irregularly, the turn-on timing of the main switch M varies irregularly as well. Therefore, the EMI caused by the harmonics may be reduced.

The second SR flipflop 423 can generate a signal U3 according to the signal U2 and the PWM clock signal SCLK and transmit the signal U3 to the NOR gate 424. When a signal of the high level is input to the set terminal S, the second SR flipflop 423 may generate the signal U3 of the low level and output it through the inverted output terminal /Q. In addition, when a signal of the high level is input to the reset terminal R, the second SR flipflop 423 can generate the signal U3 of the high level and output it through the inverted output terminal /Q.

The NOR gate 424 may perform a NOR operation of the PWM clock signal SCLK and the signal U3 to generate a signal U4 and transmit it to the gate driver 426. In the NOR operation, a signal of the high level can be generated when input signals are the low levels, and a signal of the low level can be generated when at least one of the input signals can be the high level.

A maximum duty of the switching operation of the main switch can be determined according to the PWM clock signal SCLK. In this case, the maximum duty of a time where the PWM clock signal SCLK has the low level can be determined.

The gate driver 426 may generate the gate control signal Vgs having a voltage level for turning on the main switch M according to the signal U4 of the high level, and output the gate control signal Vgs to the gate electrode of the main switch M. In addition, the gate driver 426 may generate the gate control signal Vgs having a voltage level for turning off the main switch M according to the signal U4 of the low level, and output the gate control signal Vgs to the gate electrode of the main switch M.

When the sensing voltage Vsense reaches the feedback signal VF, the SMPS may generate and output the signal U1 of the high and low levels. Thereby, the second SR flipflop 423 can output the signal U2 of the high level to the NOR gate 424, and the NOR gate 424 can output the signal U3 of the low level to the gate driver 426. The gate driver 426 can generate the gate control signal Vgs for turning off the main switch M according to the signal U3 of the low level, and apply it to the gate electrode of the main switch M. The main switch M can be turned off, the sensing voltage Vsense can be reduced to be lower than the feedback signal VF, the signal U1 can become the high level, and the signal U2 of the low level can be input to the reset terminal of the second SR flipflop 423. In this case, when the PWM clock signal SCLK is the high level, the second SR flipflop 423 can output the signal U3 of the low level to the NOR gate 424. The NOR gate 424 can output the signal U4 of the high level at the falling edge timing where the PWM clock signal SCLK becomes the low level. The gate driver 426 can turn on the main switch M. When the cycle of the PWM clock signal SCLK in the above SMPS varies, the falling edge timing of the PWM clock signal SCLK varies, and therefore a switching cycle of the main switch M can vary irregularly.

As described, the SMPS can be synchronized with irregular turn-off timing and uses the first reference voltage VTH_1 having a predetermined level to vary the cycle of the oscillator signal VOSC waveform. With this architecture the cycle of the PWM clock signal SCLK can be varied. Accordingly, the switching operation frequency of the main switch M can vary irregularly, thus reducing the EMI. The SMPS may vary the cycle of the oscillator signal VOSC waveform by using the second reference voltage VTH_2.

In the above described embodiments, the D flipflops 121-124 generate the signals SS1-SS4 at the falling edge timing of the gate control signal Vgs input to the clock terminals clk. Also, the D flipflops 121-124 generate the signals SS1-SS4 at the rising edge timing of the gate control signal Vgs input to the clock terminals clk. At this time, the inverter 125 may not be necessary. In addition, the D flipflops 121-124 can use the signal U1 instead of the gate control signal Vgs. That is, the D flipflops 121-124 can generate the signals SS1-SS4 at the falling edge timing or at the rising edge timing of the signal U1 input to the clock terminals clk.

The above described embodiments may be utilized in a SMPS in which the main switch and the switch controller are integrated in a single IC. In other architectures, the SMPS can have the main switch and the switch controller realized in separate integrated circuits and then housed in a single packaging.

In some embodiments, the frequency modulation device for varying the switching operation frequency of a main switch without providing an additional device and an SMPS using the frequency modulation device is provided.

While this invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. A frequency modulation device comprising:
   a counter for using a first clock signal having a predetermined cycle and generating at least one first signal having a cycle of an integer times the predetermined cycle of the first clock signal;
   a latch unit, configured to receive the first signal and a control signal having a varying cycle, for detecting the first signal at a reference time according to the varying cycle of the control signal and for generating a second signal corresponding to a level of the detected first signal;
   a reference signal generator for generating a first reference signal having at least two different levels according to the second signal; and
   a pulse width modulation (PWM) oscillator for generating an oscillator signal that increases with a first slope and decreases with a second slope between the first reference signal and a second reference signal, wherein the second reference signal has a level that is different from that of the first reference signal.

2. The frequency modulation device of claim 1, wherein the PWM oscillator comprises:
   a capacitor;
   a first comparator for comparing the first reference signal and the oscillator signal;
   a second comparator for comparing the second reference signal and the oscillator signal;
   a current source for charging the capacitor;
   a sync-current source for discharging the capacitor;
   a first switch coupled between the capacitor and the current source;
   a second switch coupled between the capacitor and the sync-current source; and
   an SR flipflop for controlling an on/off operation of the first and second switches according to output signals of the first and second comparators,
   wherein the oscillator signal has a voltage that corresponds to a voltage charged in the capacitor, the second switch is turned off when the first switch is turned on, and the second switch is turned on when the first switch is turned off.

3. The frequency modulation device of claim 2, wherein the first slope is determined according to a capacitance of the capacitor and the current source, and the second slope is determined according to the capacitance of the capacitor and the sync-current source.

4. The frequency modulation device of claim 2, wherein a set terminal of the SR flipflop is coupled to an output terminal of the first comparator, a reset terminal of the SR flipflop is coupled to an output terminal of the second comparator, the first reference signal is higher than the second reference signal, the first switch is turned off when the oscillator signal is higher than the first reference signal, and the second switch is turned off when the oscillator signal is reduced to the second reference signal.

5. The frequency modulation device of claim 4, wherein the oscillator signal and the first reference signal are respectively input to an inverted terminal and a non-inverted terminal of the first comparator, the second reference signal and the oscillator signal are respectively input to an inverted terminal and a non-inverted terminal of the second comparator, the first and second switches are respectively driven in response to an output signal of an inverted output terminal of the SR flipflop and an output signal of an output terminal of the SR flipflop and are turned on in response to a signal of a high level.

6. The frequency modulation device of claim 2, wherein a reset terminal of the SR flipflop is coupled to an output terminal of the first comparator, a set terminal of the SR flipflop is coupled to an output terminal of the second comparator, the second reference signal is higher than the first reference signal, the first switch is turned off when the oscillator signal is higher than the second reference signal, and the second switch is turned off when the oscillator signal is reduced to the first reference signal.

7. The frequency modulation device of claim 1, wherein
the counter includes a first toggle flipflop for generating the first signal by using the first clock signal,
the first toggle flipflop is configured to receive a signal of a first level at a first first toggle flipflop input terminal and the first clock signal at a second first toggle flipflop input terminal,
the counter being synchronized with a first time of the first clock signal to generate the first signal in response to the signal of the first level,
the latch unit including a first D flipflop including a first first D flipflop input terminal receiving the first signal and a second first D flipflop input terminal receiving the control signal,
the reference time is a time where a level of the control signal is varied from a first level to a second level, and
the reference signal generator includes at least three resistors coupled in series, a first switch is coupled in parallel to one of three resistors, and the first switch is turned on/off according to the second signal.

8. The frequency modulation device of claim 7, wherein
the counter includes a second toggle flipflop including a first second toggle flip-flop input terminal receiving the signal of the first level and a second second toggle flip-flop input terminal receiving the first signal and is synchronized with a second time of the first signal to generate a third signal in response to the signal of the first level,
the latch unit further includes a second D flipflop including a first second D flip-flop input terminal receiving the third signal and a second second D flipflop input terminal signal receiving the control signal,
the second D flipflop is configured to detect the third signal at the reference time to generate a fourth signal corresponding to a level of the third signal,
the reference signal generator further includes a second resistor coupled in series to the at least three resistors and further includes a second switching element coupled in parallel to the second resistor, and
the second switching element is turned on/off according to the fourth signal.

9. The frequency modulation device of claim 8, wherein the first time is a rising edge timing of the first clock signal, a second time is a rising edge timing of the first signal, the first toggle flipflop is configured to invert a current output state of the first signal in response to the signal of the first level at the first time, and the second toggle flipflop is configured to invert a current output state of the third signal in response to the signal of the first level at the second time.

10. The frequency modulation device of claim 1, wherein the counter includes a first toggle flipflop for generating the first signal by using the first clock signal, a signal of a first level is input to a first first toggle flipflop input terminal, the first clock signal is input to a second first toggle flipflop input terminal, the counter is synchronized with a first time of the first clock signal to generate the first signal in response to the signal of the first level,
the latch unit includes a first D flipflop including a first first D flipflop input terminal configured to receive the first signal and a second first D flipflop input terminal configured to receive the control signal,
the reference time is a time where a level of the control signal is varied from the first level to a second level, and
the reference signal generator includes a current copy circuit for copying a reference current in a predetermined ratio and a switching element electrically coupled to the current copy circuit.

11. A switching mode power supply (SMPS) comprising a transformer and a main switch coupled to a primary coil of the transformer, for supplying power to a secondary coil of the transformer according to a switching operation of the main switch, the SMPS comprising:
a frequency modulation device for generating an oscillator signal having a first varying cycle; and
a switch controller, configured to receive the oscillator signal, for generating a varying-cycle gate control signal for controlling the main switch by using (i) a pulse width modulation (PWM) clock signal having a second varying cycle corresponding to the first varying cycle of the oscillator signal, (ii) a feedback signal corresponding to a voltage of the secondary coil of the transformer, and (iii) a detection signal corresponding to a current flowing through the main switch,
wherein the frequency modulation device is configured to receive the varying-cycle gate control signal and to generate (i) least one first signal having a predetermined cycle, (ii) a second signal corresponding to a level of the first signal latched at a reference time when a first control signal level of the varying-cycle gate control signal is changed to a second control signal level, (iii) a first reference signal having at least two different levels according to the second signal, and (iv) the oscillator signal that increases along a first slope during a first period and decreases along a second slope during a second period between the first reference signal and a second reference signal having a level that is different from that of the first reference signal, and the first varying cycle corresponds to a sum of the first and second periods.

12. The SMPS of claim 11, wherein the frequency modulation device comprises:
a counter for using a first clock signal having the predetermined cycle to generate at least one first signal having a cycle of an integer times the predetermined cycle of the first clock signal;
a latch unit, configured to receive the first signal and the varying-cycle gate control signal, for detecting the first signal at the reference time according to the varying-cycle gate control signal, and generating the second signal corresponding to the level of the detected first signal;
a reference signal generator for generating the first reference signal having at least two different levels according to the second signal; and
a PWM oscillator for generating the oscillator signal.

13. The SMPS of claim 12, wherein the PWM oscillator comprises:
a capacitor;
a first comparator for comparing the first reference signal and the oscillator signal;
a second comparator for comparing the second reference signal and the oscillator signal;
a current source for charging the capacitor;
a sync-current source for discharging the capacitor;

a first switch coupled between the capacitor and the current source;

a second switch coupled between the capacitor and the sync-current source; and an SR flipflop for controlling an on/off operation of the first and second switches according to output signals of the first and second comparators, wherein the oscillator signal has a voltage that is the same as that charged in the capacitor, the second switch is turned of when the first switch is turned on, and the second switch is turned on when the first switch is turned off.

14. The SMPS of claim 13, wherein the first slope is determined according to capacitance of the capacitor and the source-current source, and the second slope is determined according to the capacitance of the capacitor and the sync-current source.

15. The SMPS of claim 13, wherein a set terminal of the SR flip-flop is coupled to an output terminal of the first comparator, a reset terminal of the SR flipflop is coupled to an output terminal of the second comparator, the first reference signal is higher than the second reference signal, the first switch is turned off when the oscillator signal is higher than the first reference signal, and the second switch is turned off when the oscillator signal is reduced to the second reference signal.

16. The SMPS of claim 15, wherein the oscillator signal and the first reference signal are respectively input to an inverted terminal and a non-inverted terminal of the first comparator, the second reference signal and the oscillator signal are respectively input to an inverted terminal and a non-inverted terminal of the second comparator, the first and second switches are respectively driven in response to an output signal of an inverted output terminal of the SR flipflop and an output signal of an output terminal of the SR flipflop and are turned on in response to a signal of a high level.

17. The SMPS of claim 12, wherein the counter includes a first toggle flipflop for generating the first signal by using the first clock signal, a signal of a first level is input to a first input terminal of the first toggle flip-flop, the first clock signal is input to a second input terminal of the first toggle flip-flop, the counter is synchronized with a first time of the first clock signal to generate the first signal in response to the signal of the first level, the latch unit includes a first D flipflop including a first input terminal receiving the first signal and a second input terminal receiving the varying-cycle gate control signal, and the reference signal generator includes at least three resistors coupled in series, a first switch is coupled in parallel to one of three resistors, and the first switch is turned on/off according to the second signal.

18. The SMPS of claim 17, wherein the counter further includes a second toggle flipflop including a first input terminal receiving the signal of the first level and a second input terminal receiving the first signal and is synchronized with a second point of time of the first signal to generate a third signal in response to the signal of the first level, the latch unit further includes a second D flipflop including a first input terminal receiving the third signal and a second input signal receiving the control signal, the second D flipflop configured to detect the third signal at the reference time to generate a fourth signal corresponding to a level of the third signal, the reference signal generator further includes a second resistor coupled in series to the at least three resistors and further includes a second switching element coupled in parallel to the second resistor, and the second switching element is turned on/off according to the fourth signal.

19. The SMPS of claim 18, wherein the first time is rising edge timing of the first clock signal, a second point of time is rising edge timing of the first signal, the first toggle flipflop inverts a current output state of the first signal in response to the signal of the first level at the first point of time, and the second toggle flipflop inverts a current output state of the third signal in response to the signal of the first level at the second point of time.

20. The SMPS of claim 12, wherein the counter includes a first toggle flipflop for generating the first signal by using the first clock signal, a signal of a first level is input to a first input terminal of the first toggle flipflop, the first clock signal is input to a second input terminal of the first toggle flipflop, the counter is synchronized with a first point of time of the first clock signal to generate the first signal in response to the signal of the first level, the latch unit includes a first D flipflop including a first input terminal receiving the first signal and a second input terminal receiving the varying-cycle gate control signal, and the reference signal generator includes a current copy circuit for copying a reference current in a predetermined ratio and a switching element electrically coupled to the current copy circuit.

21. The SMPS of claim 11, wherein the switch controller further includes a PWM oscillator for detecting a maximum value or a minimum value of the oscillator signal, determining the first varying cycle, and generating the PWM clock signal having the second varying cycle that is the same as the first varying cycle; the switch controller configured to generate the gate control signal for turning off the main switch when the detection signal reaches a level of the feedback signal, and to generate the gate control signal for turning on the main switch at a first time where a level of the PWM clock signal is varied from a first level to a second level after the main switch is turned off.

22. The SMPS of claim 21, wherein the switch controller comprises:

a comparator for comparing the detection signal and the feedback signal;

an SR flipflop for receiving an output signal of the comparator and the PWM clock signal, outputting a signal of a fourth level to a first output terminal when the output signal of the comparator is a third level, and generating a signal of a fifth level according to the PWM clock signal at the first point of time; and a logic operation unit for receiving an output signal of the SR flipflop and the PWM clock signal and performing a logic operation of the input signal, and the switch controller for generating the varying-cycle gate control signal for turning on the main switch according to a signal output by the logic operation unit when the two input signals are sixth levels.

23. The SMPS of claim 22, wherein the frequency modulation device comprises:

a counter for using a first clock signal having the predetermined cycle to generate at least one first signal having a cycle of an integer times the cycle of the first clock signal;

a latch unit, configured to receive the first signal and the varying-cycle gate control signal, for detecting the first signal at the reference time according to the varying-cycle gate control signal, and generating the second signal corresponding to the level of the detected first signal;

a reference signal generator for generating the first reference signal having at least two different levels according to the second signal; and a PWM oscillator for generating the oscillator signal.

24. The SMPS of claim 22, wherein the first, third, and fourth levels are high levels, and the second, fifth, and sixth levels are low levels.

25. The SMPS of claim 11, further comprising an integrated circuit in which the main switch and the switch controller are integrated in one packaging.

26. The SMPS of claim 11, further comprising an integrated circuit in which the main switch and the switch controller are respectively formed in different packagings.

* * * * *